(12) United States Patent
Bathiche et al.

(10) Patent No.: US 10,698,504 B2
(45) Date of Patent: Jun. 30, 2020

(54) DETECTING INPUT PRESSURE ON A STYLUS PEN

(71) Applicant: Microsoft Technology Licensing, LLC, Redmond, WA (US)

(72) Inventors: Steven Bathiche, Kirkland, WA (US); Michael Jensen, Duvall, WA (US); Flavio Protasio Ribeiro, Bellevue, WA (US); Gabriel Pirie, Seattle, WA (US); Vineet Thuvara, Sammamish, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 14/740,025

(22) Filed: Jun. 15, 2015

(65) Prior Publication Data

US 2016/0364023 A1    Dec. 15, 2016

(51) Int. Cl.
*G06F 3/0354* (2013.01)
*G06F 3/038* (2013.01)
*G06F 3/044* (2006.01)

(52) U.S. Cl.
CPC ........ *G06F 3/03545* (2013.01); *G06F 3/0383* (2013.01); *G06F 3/044* (2013.01); *H03K 2217/96054* (2013.01)

(58) Field of Classification Search
CPC ...... G06F 3/044; G06F 3/046; G06F 3/03545; G06F 3/03547; G06F 3/041;
(Continued)

(56) References Cited

U.S. PATENT DOCUMENTS

| 4,670,751 A | 6/1987 | Enokido et al. |
| 4,883,926 A | 11/1989 | Baldwin |

(Continued)

FOREIGN PATENT DOCUMENTS

| CN | 102122216 A | 7/2011 |
| CN | 202677317 U | 1/2013 |
| WO | WO 2013/160887 A1 | 10/2013 |

OTHER PUBLICATIONS

"HP Slate 7 Beats Special Edition, HP Slate 7 Extreme Tablets—Drawing and Writing with the DirectStylus Pen (Android KitKat, Jelly Bean)", Retrieved on: Apr. 9, 2015; Available at: http://support.hp.com/us-en/document/c04024883, 14 pages.

(Continued)

*Primary Examiner* — Kent W Chang
*Assistant Examiner* — Sujit Shah
(74) *Attorney, Agent, or Firm* — Alleman Hall Creasman & Tuttle LLP

(57) ABSTRACT

A stylus pen that can be used as an input device to a digitizer associated with a computer screen on a computing device, such as a computer, mobile device, tablet, etc. The stylus pen can include an end cap that has multiple pressure thresholds for implementing different user-input commands. To detect the pressure being applied to the end cap, the cap is movable relative to a stylus pen body so as to move a plunger in proximity or contact with a mechanical switch. The mechanical switch is a single-action switch that is converted to a dual-action switch by using the electrical conductivity of the switch to detect an electrical coupling between a plunger and the switch. The electrical coupling can be in the form of a capacitive coupling or a direct electrical connection. Further pressure can be detected through actuation of the mechanical switch.

16 Claims, 6 Drawing Sheets

(58) Field of Classification Search
CPC ...... G06F 3/0354; G06F 3/048; G06F 3/0416;
G06F 3/02545; G06F 3/0383; H03K
17/9622; H03K 2217/96054
USPC .................................................. 345/173–174
See application file for complete search history.

(56) References Cited

U.S. PATENT DOCUMENTS

| | | | |
|---|---|---|---|
| 5,576,502 A | 11/1996 | Fukushima et al. | |
| 5,793,360 A | 8/1998 | Fleck et al. | |
| 5,818,431 A * | 10/1998 | Oh | G06F 3/03545 345/179 |
| 6,310,615 B1 | 10/2001 | Davis et al. | |
| 6,924,792 B1 | 8/2005 | Jessop | |
| 7,486,282 B2 | 2/2009 | Russo | |
| 8,094,140 B2 | 1/2012 | Katsurahira et al. | |
| 8,355,008 B2 | 1/2013 | Wu | |
| 2004/0150632 A1 | 8/2004 | Clapper | |
| 2004/0160429 A1* | 8/2004 | Blake | G06F 3/03545 345/179 |
| 2009/0079699 A1* | 3/2009 | Sun | G06F 3/0486 345/173 |
| 2009/0114459 A1 | 5/2009 | Fukushima et al. | |
| 2010/0051356 A1* | 3/2010 | Stern | G06F 3/03545 178/19.04 |
| 2010/0117994 A1 | 5/2010 | Fukushima et al. | |
| 2011/0080378 A1 | 4/2011 | Hsu | |
| 2012/0075486 A1* | 3/2012 | Lee | G06F 3/023 348/207.99 |
| 2012/0293425 A1 | 11/2012 | Lee et al. | |
| 2012/0331546 A1* | 12/2012 | Falkenburg | G06F 3/03545 726/16 |
| 2013/0106802 A1 | 5/2013 | Liaw et al. | |
| 2013/0321355 A1* | 12/2013 | Teiblum | G06F 3/03545 345/179 |
| 2014/0002422 A1* | 1/2014 | Stern | G06F 3/03545 345/179 |
| 2014/0078070 A1 | 3/2014 | Armstrong-Muntner | |
| 2014/0146021 A1* | 5/2014 | Trethewey | G06F 3/0488 345/179 |
| 2014/0354577 A1* | 12/2014 | Hanssen | G06F 3/044 345/174 |
| 2015/0029161 A1 | 1/2015 | Koo et al. | |

OTHER PUBLICATIONS

International Search Report and Written Opinion for PCT/US2016/032240, dated Sep. 5, 2016, 14 pages.
Second Written Opinion Issued in PCT Application No. PCT/US2016/032240, dated May 19, 2017, 7 Pages.
"International Preliminary Report on Patentability Issued in PCT Application No. PCT/US2016/032240", dated Sep. 27, 2017, 8 Pages.
"Office Action Issued in European Patent Application No. 16736932.1", dated Feb. 5, 2019, 11 Pages.
"Office Action Issued in European Patent Application No. 16736932.1", dated Oct. 24, 2019, 6 Pages.
"First Office Action and Search Report Issued in Chinese Patent Application No. 201680035052.X", dated Mar. 19, 2020, 19 Pages.

* cited by examiner

DETECTING INPUT PRESSURE ON A STYLUS PEN

BACKGROUND

A stylus or a stylus pen is often used as an input device to a digitizer associated with a computer screen, mobile device, graphics tablet, etc. With touchscreen devices, a user places a stylus on the surface of the screen to draw or make selections by tapping the stylus on the screen. As such, the stylus is used as a pointing device instead of a mouse or trackpad.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

A stylus pen is disclosed that can be used as an input device to a digitizer associated with a computer screen on a computing device, such as a computer, mobile device, tablet, etc. The stylus pen can include an end cap that has multiple pressure thresholds for implementing different user-input commands. To detect the pressure being applied to the end cap, the cap is movable relative to a stylus pen body so as to move a plunger in proximity or contact with a mechanical switch. The mechanical switch is a single-action switch that is converted to a dual-action switch by using the electrical conductivity of the switch to detect an electrical coupling between a plunger and the switch. The electrical coupling can be in the form of a capacitive coupling or a direct electrical connection. Further pressure can be detected through actuation of the mechanical switch.

As a result, a single-action mechanical switch can be used to generate two separate actions based on first and second pressure thresholds. One advantage of a single-action mechanical switch is that it is more cost effective than multi-action mechanical switches and has a lower failure rate. Additionally, the actuation force associated with the plunger needed to trigger an erasure action is independent of the actuation force of the mechanical switch. As such, the first and second pressure thresholds can be independently adjusted. For example, the first pressure threshold can be lowered without impacting the second pressure threshold. A multi-function switch, by contrast, does not have this possibility as both pressure thresholds change depending on the multi-function switch used.

The foregoing and other objects, features, and advantages of the invention will become more apparent from the following detailed description, which proceeds with reference to the accompanying figures.

DETAILED DESCRIPTION

Figure 1:
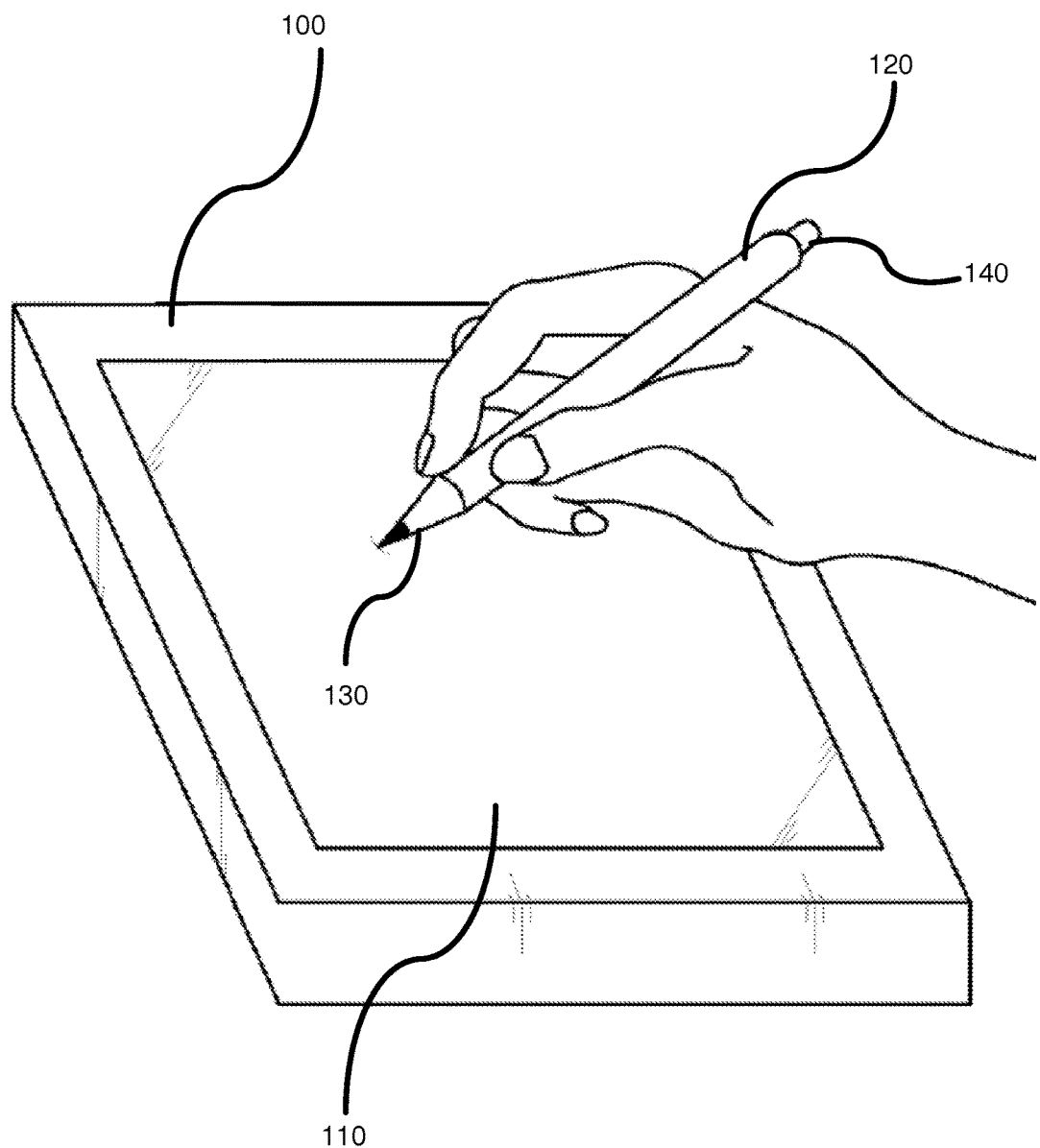
FIG. 1 is a diagram illustrating a user writing on a computing device using a stylus pen according to one embodiment.

There is limited space for circuitry in a stylus, and any functionality should be built with minimal components. Consequently, multiple functions can be built into user input components, such as buttons or switches. In one example, when an erasure portion of the stylus presses against a surface of a screen, a light pressure can be detected so as to activate an erasure signal. The same erasure portion of the stylus can be clicked by a user with a greater force to perform a different function, such as to generate a command to open files, etc. Controlling an amount of pressure needed for these functions improves a user experience.

The present description is for a stylus pen that can be used as an input device to a digitizer associated with a computer screen on a computing device, such as a computer, mobile device, tablet, or other device. As used herein, a stylus includes any digital pen and can have increased functionality, such as programmable buttons, pressure sensitivity and electronic erasers. In one embodiment, a stylus-based signal is transmitted on a plunger within the stylus pen. The plunger is movable within the stylus pen and the movement is resisted by a compression spring. A stylus signal is transmitted through the plunger and an end of the plunger is configured as one capacitor plate relative to a second capacitor plate formed by a conductive mechanical switch, such as a dome-type switch. The mechanical switch is electrically coupled to a controller, which is a circuit, such as a microcontroller, microprocessor, hardware logic, or other circuit to create a charge transfer circuit or other capacitive sensing circuit so as to measure the capacitance between the two capacitor plates. As force is applied to the electrode plunger, it moves against the spring and moves the two plates closer together. This difference in capacitance is measured and used by the system to discern the switch position relative to the desired stylus function.

In another embodiment, a physical connection can be detected between the plunger and the mechanical switch. In a first actuation, the spring is displaced enough that the electrode touches a dome associated with the mechanical switch. Additional force causes the mechanical switch to actuate (based on its snap force) and a second actuation occurs. The different actuations can be interfaced to control circuitry that handles the appropriate functions associated with the actuations.

The controller can detect the distance between the plunger and the mechanical switch, for example, based on measuring the capacitance between the plunger and the mechanical switch. The controller can also detect when the plunger makes contact with the mechanical switch. Further, the controller can detect when the plunger forces the mechanical switch to actuate. In one alternative, the switch may be implemented using a force-resistive sensor and/or piezoresistive circuit in combination with a haptic feedback mechanism, such as a piezoresistive circuit that can be driven with a voltage waveform that simulates the feel of a mechanical switch actuation. In this alternative, the controller can detect the amount of actuation of switch as the switch moves from an unactuated state to an actuated state. These states may be implemented by selecting force thresholds programmed into the controller, where the force thresholds are associate with forces placed onto the switch.

In general, the controller can detect at least the following: (1) an analog range of the plunger-to-switch distance (which may be useful for, e.g., informing a system how hard the user is erasing digital ink); (2) whether the plunger is in contact with the mechanical switch (which may be useful for, e.g., informing a system that the erasing force is at a maximum); and (3) whether the mechanical switch is actuated (which may be useful for, e.g., informing a system that the switch has been activated and that the system should, in response, take action such as launching an application). A debounce circuit may be used in scenario (3) to filter inadvertent actuations of the switch. In one alternative, the controller may also detect how far the switch has deflected before actuation has been achieved.

FIG. 1 is a diagram showing a computing device 100 that includes a touch screen 110 responsive to a stylus pen 120 via a digitizer to allow a user to write, erase, or move content displayed on the touch screen. The stylus pen 120 typically includes a first end 130, called a stylus tip, for writing content and a second end 140 for performing a digital erasure of the content. The second end 140 can have additional functionality based on a degree of pressure applied thereto. In one example, the second end 140 can be clicked like a traditional pen in order to generate signals that are interpreted by the computing device 100 to perform a desired input function. As further described below, the stylus pen tip 130 and eraser end 140 transmit signals to the computing device 100 so as to operate as a user input device.

Figure 2:
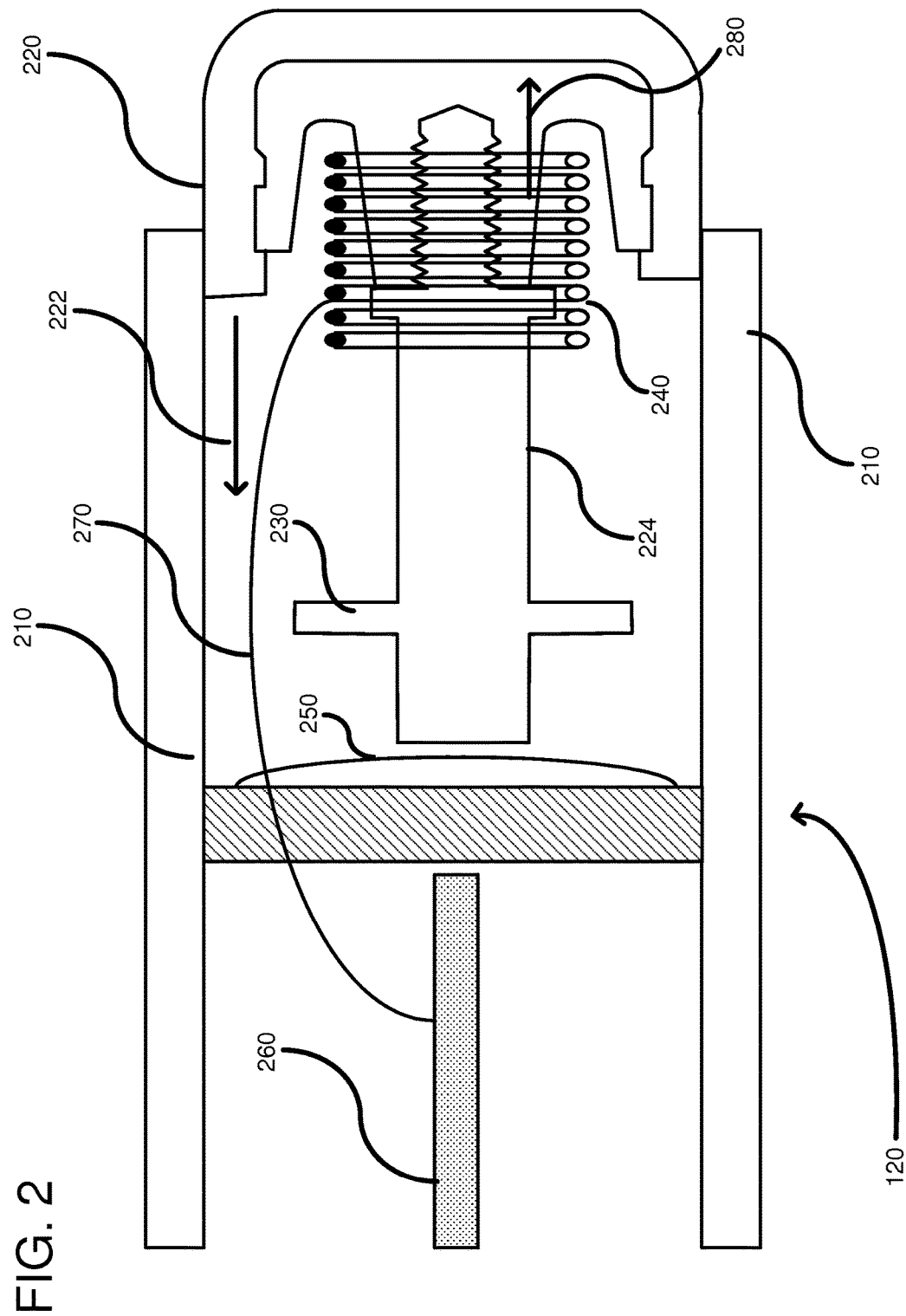
FIG. 2 is a cross-sectional diagram of an eraser end of a stylus pen.

FIG. 2 shows further details of the stylus pen 120, particularly at the erasure end 140. The stylus pen 120 includes a stylus pen outer body 210 and a cap 220 that is slideably mounted within the stylus body as indicated by an arrow 222. The cap 220 is threadably coupled to a plunger 224, which is also moveable within the stylus body 210 when a pressure is applied to the cap in the direction of arrow 222. Anti-rotational flanges 230 protrude from each side of the plunger 224 and prevent rotation of the plunger. Coupled to the cap and the plunger is a compression spring 240 that provides spring action to the cap when it is moved in a direction 222 into the stylus body 210. The compression spring 240 creates an increasing restoring force as the cap 220 is further depressed. A single-action switch 250 is spaced apart from the plunger 224 when the compression spring 240 is in a relaxed state. However, pressure upon the cap in the direction of arrow 222 causes the plunger to move so as to close the gap and establish contact with the mechanical switch 250. The single-action switch 250 can be a made of conductive material, such as a metal, so as to allow a circuit to transmit a signal through single-action switch 250. As further described below, when the plunger makes electrical contact or is within a close proximity with the mechanical switch 250, a controller 260 can detect an electrical signal passing between the plunger 224 and the mechanical switch 250. The controller 260 can be any type of control circuit and can include a general-purpose central processing unit (CPU), processor in an application-specific integrated circuit (ASIC), or any other type of processor or control hardware/firmware. Typically, the controller includes software for performing a portion of the functionality described herein. A first threshold amount of pressure or force on the cap 220 in the direction 222 is necessary in order to create a circuit through which current flows. In response to this first threshold pressure level, the controller 260 can transmit an eraser signal (i.e., an electronic function) over a conductor 270. The conductor 270 is coupled at a first end to the controller 260 and at a second end to the spring 240. The spring 240, in turn, passes the electrical signal to the cap 220 for transmission to the computing device for erasing content on the screen. The signal on the conductor 270 is also passed back through the plunger 224 and the mechanical switch 250 to the controller 260 so that the controller can detect that the pressure is being maintained on the end cap 220. Once pressure is released on the cap 220, the spring 240 which is in a compressed state, naturally moves in the direction of arrow 280 to return to a relaxed state. Consequently, the plunger 224 moves in the direction of arrow 280 thereby creating the gap between the plunger and the mechanical switch 250. As a result of this action, the electrical connection between the plunger and the mechanical switch 250 is broken and the controller 260 ceases to transmit the eraser signal on conductor 270.

In practice, a user lightly presses the cap 220 against the screen of the computing device. An amount of pressure needed to create the closed-circuit loop described above depends upon properties of the spring 240. In any event, an electrical circuit is formed through the combination of the plunger and the mechanical switch that allows detection of the plunger position without physical actuation (e.g., deformation) of the switch. As such, the plunger and the mechanical switch cooperate to form at least a single-action pressure sensor. As further described below, if further pressure is applied to the plunger, the mechanical switch can be actuated so as to generate a second pressure measurement. Through the first and second pressure measurements, a dual-action switch can be formed using a traditional single-action switch. The first pressure amount is dictated by the spring restoring force, while the second pressure amount depends on the actuation force of the mechanical switch in conjunction with the spring.

By controlling the threshold pressures through separate components, such as the spring and the mechanical switch, greater design freedom is provided for controlling an amount of pressure that causes actuation. For example, the spring can be used to control a first level of restoring force so as to dictate a first pressure level. Typically, a very light pressure can be used, such as when the user touches an eraser end of the stylus pen to a screen. An example pressure to actuate the eraser functionality can be between 50 and 100 grams. In response to detection of the first pressure, a first electronic function can be performed. Conversely, a user can apply a much greater pressure in order to actuate the mechanical switch, such as a user clicking an end of the pen. The mechanical switch can control a second level of operating force to dictate a second pressure level. An example pressure could be 300 grams or whatever desired amount through modification of the mechanical switch. For example, a simple dome switch can be single, double, or triple layered, or have even more layers, so as to have differing levels of operating force. In response to the detection of the second pressure, a second electronic function can be performed.

Figure 3:
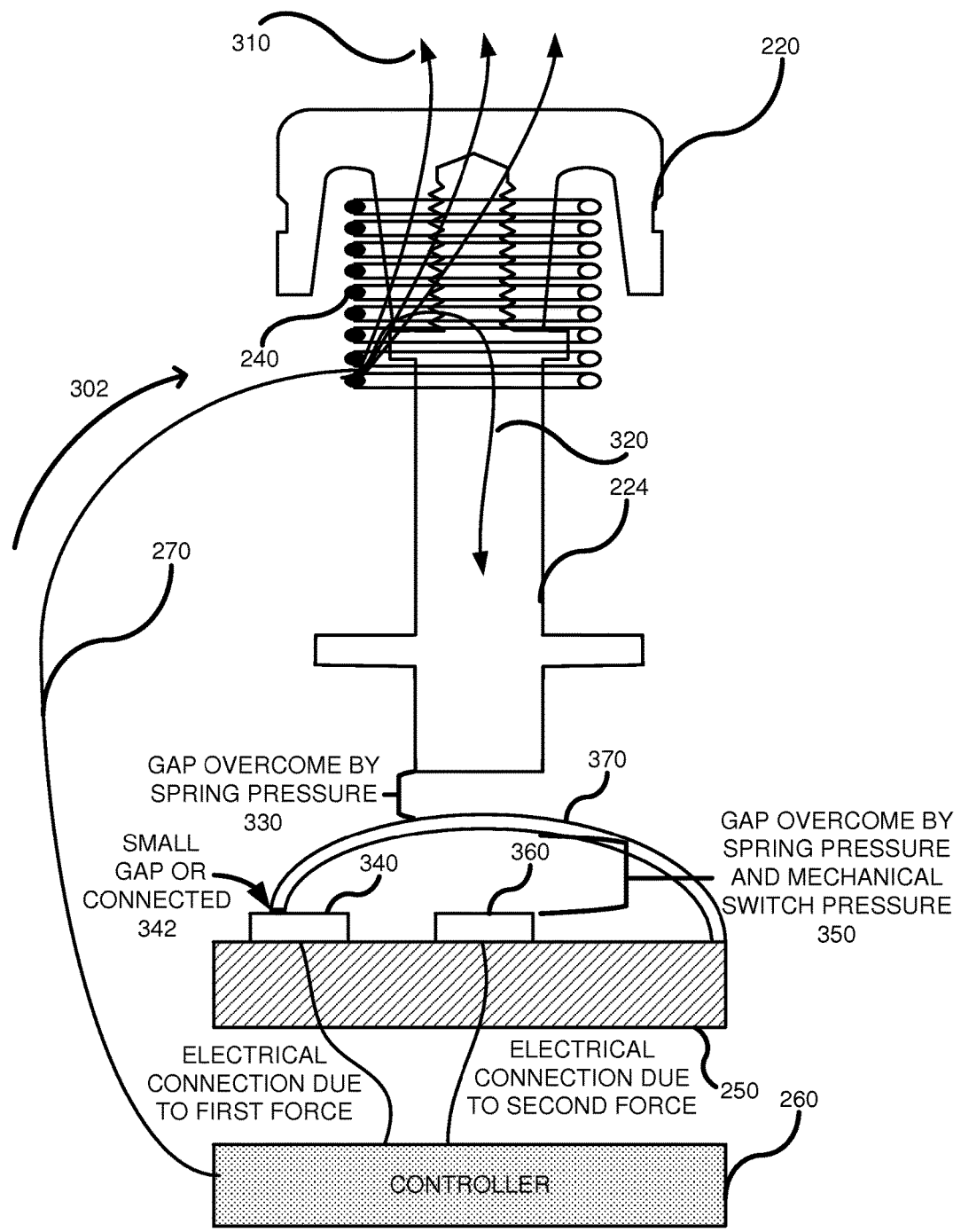
FIG. 3 is a detailed diagram illustrating components within the eraser end of the stylus pen.

FIG. 3 shows additional details of the eraser end of the stylus pen. In this embodiment, the controller 260 is shown as transmitting a signal 302 over the conductor 270, which is coupled to the spring (the spring being made of a conductive metal). Through electrical coupling between the spring 240 and the cap 220 (which is also at least partially conductive), the signals are transmitted out of the cap 220, as indicated at 310. The signals can be synchronization signals, eraser signals, or signals carrying information regarding input functions, protocol communications, or other information that are communicated to the external computing device, such as a digitizer. The plunger 224 can also be formed of conductive material or at least a portion thereof has a conductive channel for propagating signals from one end to an opposite end. As a result, this same electrical signal 302 is also propagated back through the plunger as indicated at 320 in the direction of the mechanical switch 250. The mechanical switch 250 can include first and second conductive pads 340, 360, respectively, and a conductive dome-shaped deformable member 370. The mechanical switch can also include non-conductive portions, such as a base. When the plunger is in an at-rest state (i.e., no spring compression), due to a distance of a gap 330 between an end of the plunger 224 and the mechanical switch 250, the electrical signal 302 has no electrical impact on signals passed to the controller 260. As pressure is exerted on the cap 220 in the direction of the mechanical switch 250, the gap 330 closes. As such, either a capacitive effect changes across the gap 330 so as to create an electrical circuit or the plunger 224 physically contacts the mechanical switch 250. The mechanical switch 250 is made of conductive material, such as metal, and the electrical signal passes through the conductive portion 370 of the mechanical switch to a first pad 340 that is electrically coupled to the controller 260. As a result, an electrical circuit is completed as the signal passes from the controller on the conductor 270 through the spring 240 and the plunger 224 and back to the controller 260. A closed-loop circuit is consequently formed through movement of the plunger and the controller 260 can monitor and detect changes in the circuit and correspondingly modify the signals 302 so as to provide alternative transmissions (i.e., alternative user input commands) to the computing device. In a typical application, sufficient pressure on the cap 220 that causes the plunger 224 to electrically contact the switch 250 results in the controller changing from a synchronization transmission signal to an erasure transmission signal.

As shown at 342, a small gap may be present between the mechanical switch 250 and the pad 340. This gap 342 is overcome with insignificant pressure exerted downwardly on the mechanical switch 250, such as when the plunger contacts the switch. Alternatively, the gap can be eliminated and the switch 250 can be directly connected to the pad 340. In the case where capacitive coupling between the plunger and mechanical switch is detected (as opposed to direct electrical connection), the gap 342 should be closed so as to directly connect the mechanical switch to the pad 340.

If further pressure is supplied to the plunger 224, the mechanical switch, which has a gap shown at 350, begins to depress until the top of the switch comes in contact with the pad 360. When this occurs, the signal 302 passes through the plunger to the dome portion 370 of the mechanical switch 250 and through the second pad 360 to the controller 260. Simultaneously, the signal 302 is also detectable by the controller via the first pad 340 so that both the electrical connection due to the first force and the electrical connection due to the second force are supplied to the controller 260. When this second force is detected by the controller 260, the controller can take a separate action from what it would take if the eraser signal were detected. As further described below, the controller can transmit control signals through a separate transmitter using a separate protocol than was transmitted using the signals 302. For example, the controller can send control functions to the computing device through a Bluetooth protocol. Other transmitters and transmission protocols can be used. The controller can also cease sending the erasure signal 302 in response to detection of the second force.

In an alternative embodiment, a signal can be generated by the controller 260 in an opposite direction to that shown in FIG. 3. For example, the controller can generate a signal that is passed through the pad 340 to the dome portion 370 of the mechanical switch 250. When the plunger 224 moves sufficiently close to the mechanical switch 250 so as to close a circuit, the controller can detect the closed circuit as the signal can be detected on conductor 270. Consequently, the particular circuit configuration is design specific and many alternatives can be used.

In the embodiments described herein, the mechanical switch 250 is shown as a dome switch, but other switches can be used. Example switches are tactile switches, or any electromechanical switch that responds to manual operation to connect one or more sets of electrical contacts. In the case of the dome switch, the switch deforms to connect the conductive outer dome 370 to the pad 360 and when pressure is released, the dome snaps back to its original form through natural spring action of the dome 370.

Figure 4:
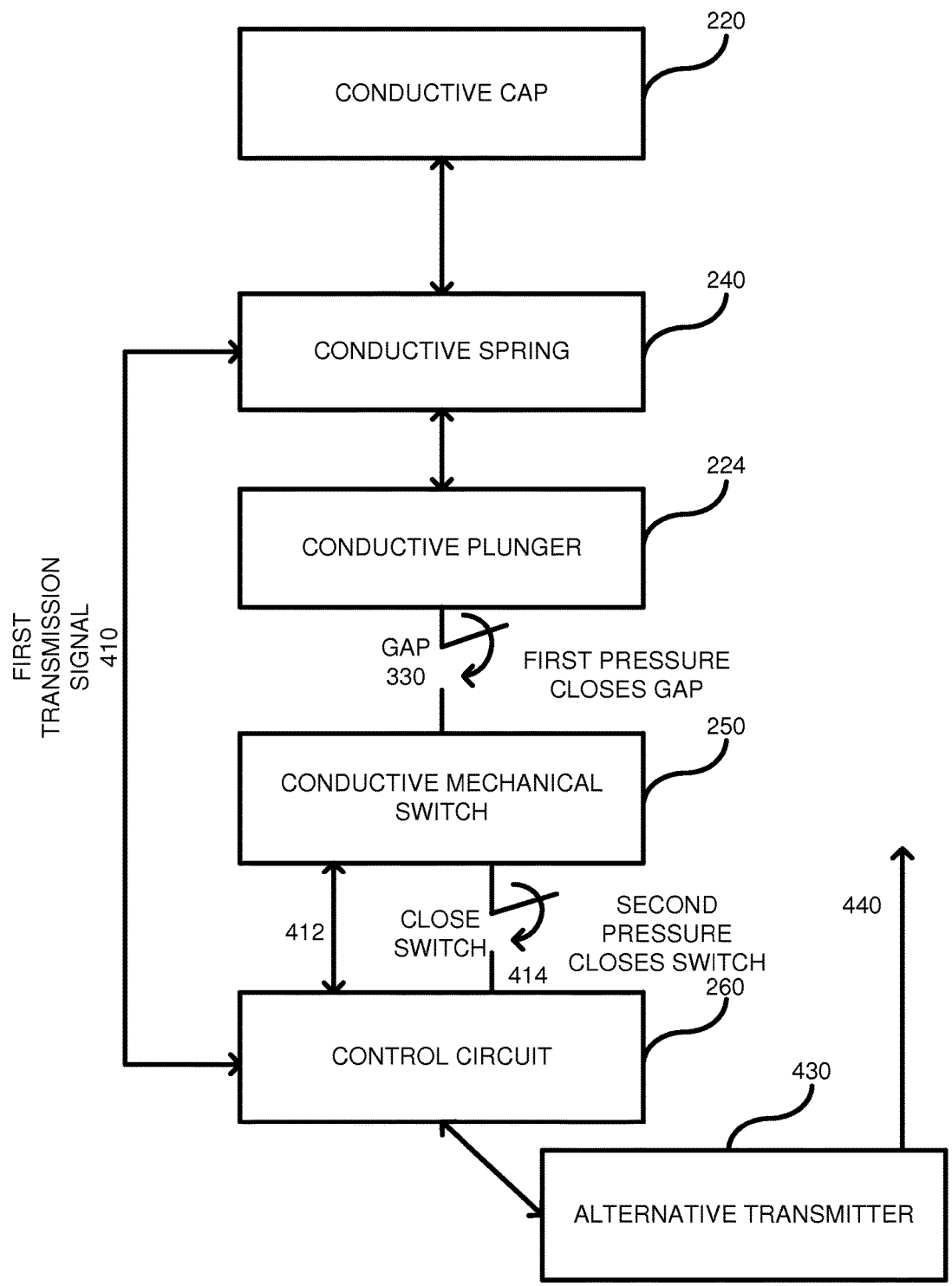
FIG. 4 is an electrical diagram showing an electrical relationship between the different components in the eraser end of the stylus pen.

FIG. 4 shows an electrical diagram according to one embodiment illustrating the components that form the eraser end of the stylus pen. In this embodiment, the conductive cap 220 (which is at least partially conductive) is electrically coupled to the conductive spring 240. The control circuit 260 transmits a first transmission signal 410 through the conductive spring to the cap 220, and out of the end of the stylus pen. Additionally, the transmission signal passes from the conductive spring 240 to the conductive plunger 224. When pressure is exerted on the conductive plunger, the gap 330 closes and acts like a direct electrical connection between the conductive plunger and the conductive mechanical switch 250 (which is at least partially conductive). The first transmission signal 410 is then received by the control circuit 260 directly via the conductive mechanical switch along an electrical conductor 412. If the plunger continues to exert a downward force on the mechanical switch 250, the plunger closes the switch so that the transmission signal 410 passes from the conductive mechanical switch to the control circuit 260 along the conductive path 414. In response to receiving the signal 412, the control circuit can transmit and eraser signal along the path of the first transmission signal 410. However, if the first transmission signal 410 is received over the electrical connection 414, then the control circuit 260 can perform an alternative function. The alternative function can be transmitted over the same signal path as the first transmission signal 410 or, alternatively, the control circuit 260 can send a control signal to an alternative transmitter, such as a Bluetooth transmitter 430 that can transmit a signal as shown at 440 using an alternative protocol and an alternative transmission path. In a practical application, the alternative transmission can be in response to a user clicking the erasure end of the stylus pen so as to provide a user input command, such as open file, close file, launch or close a program or application, or any other command.

Figure 5:
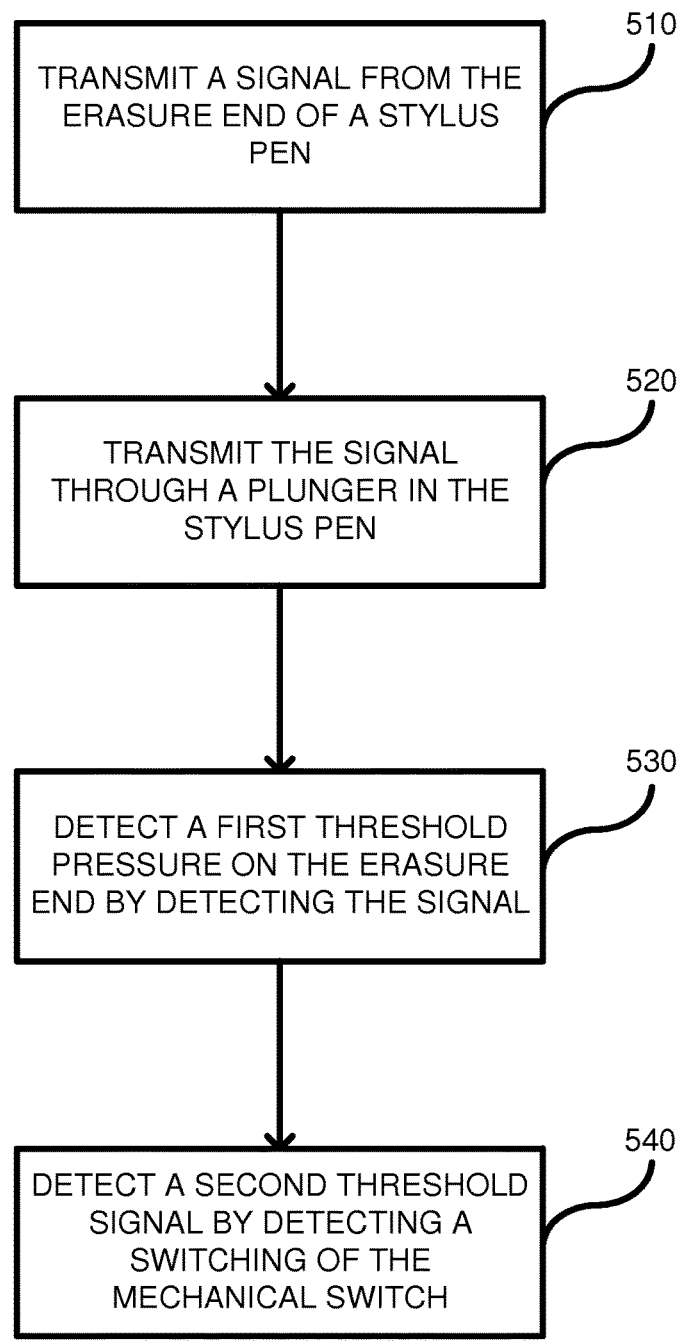
FIG. 5 is a flow diagram according to one embodiment of a method for implementing pressure sensing in a stylus pen.

FIG. 5 is a flowchart of a method for detecting pressure on an erasure end of a stylus pen. In process block 510, a signal is transmitted from an erasure end of the stylus pen. The signal can be any of a variety of signals for communicating with a computing device, such as a digitizer. Example signals can include an erasure signal or a synchronization signal to synchronize the stylus and the computing device. In process block 520, the same signal is transmitted back through the plunger in the stylus pen and is used to detect an amount of pressure applied to a stylus cap. In process block 530, a first threshold pressure is detected on the erasure end by detecting the signal. Thus, a distance of movement of the plunger is detected due to the plunger completing a circuit within the stylus pen. The circuit can be due to contact between the plunger and another metal object to complete the circuit or a capacitive coupling between an end of the plunger and a metal object. The metal object can be a single-action switch that has been extended to two functions by utilizing its conductive properties. The circuit can have signal transmission in either direction meaning that the signal can pass first through the single-action switch to the plunger or vice versa. In either case, the plunger/switch interaction and movement of the plunger relative to the switch create a circuit through which current can flow. And a controller can be used to detect that the circuit has been established. For example, the controller can include software for monitoring a hardware signal line and can detect the signal by detecting a voltage change on the hardware signal line. In the case of capacitive coupling, the controller can include an analog-to-digital converter or other hardware logic needed to detect a change of capacitance between the plunger and the mechanical switch as the gap between the two changes. In any case, whether capacitive or based on an electrical connection, establishment of the circuit is indicative that a threshold amount of pressure has been applied to the end of the cap. In process 540, a second threshold pressure can be detected through actuation of the single-action mechanical switch. In such a case, the controller can detect through a different signal path that the switch has been switched. In response to such a detection, the controller can initiate another stylus function so that the single-action switch is converted to dual functionality.

Figure 6:
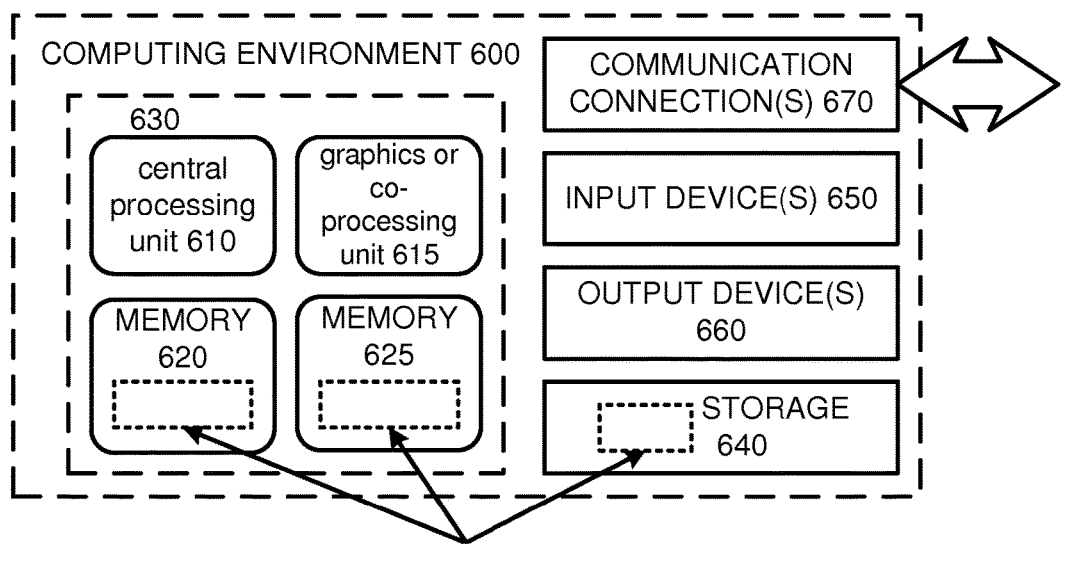
FIG. 6 is a diagram of an example computing environment in which some described embodiments can be implemented within the stylus pen.

With reference to FIG. 6, the computing system 600 includes one or more processing units 610, 615 and memory 620, 625. One or more components within the computing system 600 can be included in the stylus pen to implement the functionality described herein. Alternatively, or in addition, the computing system can include functionality of a computing device for receiving signals from the stylus pen. In FIG. 6, this basic configuration 630 is included within a dashed line. The processing units 610, 615 execute computer-executable instructions. A processing unit can be a general-purpose central processing unit (CPU), processor in an application-specific integrated circuit (ASIC), or any other type of processor. In a multi-processing system, multiple processing units execute computer-executable instructions to increase processing power. For example, FIG. 6 shows a central processing unit 610 as well as a graphics processing unit or co-processing unit 615. The tangible memory 620, 625 may be volatile memory (e.g., registers, cache, RAM), non-volatile memory (e.g., ROM, EEPROM, flash memory, etc.), or some combination of the two, accessible by the processing unit(s). The memory 620, 625 stores software 680 implementing one or more innovations described herein, in the form of computer-executable instructions suitable for execution by the processing unit(s).

A computing system may have additional features. For example, the computing system 600 includes storage 640, one or more input devices 650, one or more output devices 660, and one or more communication connections 670. An interconnection mechanism (not shown) such as a bus, controller, or network interconnects the components of the computing system 600. Typically, operating system software (not shown) provides an operating environment for other software executing in the computing system 600, and coordinates activities of the components of the computing system 600.

The tangible storage 640 may be removable or non-removable, and includes magnetic disks, magnetic tapes or cassettes, CD-ROMs, DVDs, or any other medium which can be used to store information and which can be accessed within the computing system 600. The storage 640 stores instructions for the software 680 implementing one or more innovations described herein.

The input device(s) 650 may be a touch input device such as a keyboard, mouse, pen, or trackball, a voice input device, a scanning device, or another device that provides input to the computing system 600. For video encoding, the input device(s) 650 may be a camera, video card, TV tuner card, or similar device that accepts video input in analog or digital form, or a CD-ROM or CD-RW that reads video samples into the computing system 600. The output device(s) 660 may be a display, printer, speaker, CD-writer, or another device that provides output from the computing system 600.

The communication connection(s) 670 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

The innovations can be described in the general context of computer-executable instructions, such as those included in program modules, being executed in a computing system on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing system.

The terms "system" and "device" are used interchangeably herein. Unless the context clearly indicates otherwise, neither term implies any limitation on a type of computing system or computing device. In general, a computing system or computing device can be local or distributed, and can include any combination of special-purpose hardware and/or general-purpose hardware with software implementing the functionality described herein.

For the sake of presentation, the detailed description uses terms like "determine" and "use" to describe computer operations in a computing system. These terms are high-level abstractions for operations performed by a computer, and should not be confused with acts performed by a human being. The actual computer operations corresponding to these terms vary depending on implementation.

Alternative Embodiments

Various combinations of the embodiments described herein can be implemented. For example components described in one embodiment can be included in other embodiments and vice versa. The following paragraphs are examples of such combinations:

A. A device comprising:
a body;
a plunger slideably mounted within the body, the plunger being at least partially conductive so that an electrical signal is transmittable through the plunger;
a cap coupled to the plunger;

a compression spring coupled to the plunger to provide a spring action to the cap;

a conductive mechanical switch mounted within the body such that a gap is present between the conductive mechanical switch and the plunger when the compression spring is in a relaxed state, wherein the plunger is movable towards the conductive mechanical switch when the compression spring is in a compressed state; and a circuit configured to detect a characteristic indicative of a distance between the plunger and the conductive mechanical switch, and configured to detected whether the plunger is in contact with the conductive mechanical switch.

B. The device of paragraph A, wherein the conductive mechanical switch is a dome switch that is depressable to make an electrical contact with a conductive pad.

C. The device of paragraph A or B, wherein the compression spring provides a first threshold of pressure for performing a first of two electronic functions and the mechanical switch contributes to a second threshold of pressure, different than the first threshold of pressure, for performing a second of the two electronic functions.

D. The device of any of paragraphs A through C, wherein the characteristic is a capacitance formed between the plunger and the conductive mechanical switch.

E. The device of any of paragraphs A through D, wherein the circuit is configured to detect a capacitive coupling between the plunger and the conductive mechanical switch when a distance between the conductive mechanical switch and the plunger is less than the gap.

F. The device of any of paragraphs A through E, wherein the electrical signal is an erase signal transmitted from the device to erase content on a computing device.

G. The device of any of paragraphs A through F, further including an electrical conductor coupled to the circuit and to the compression spring, the electrical conductor configured to transmit the electrical signal.

Alternative combinations can be as follows:

A. A method, comprising:

transmitting a signal from an erasure end of a stylus pen, the signal for communicating synchronization information or erasure information with a computing device;

transmitting the signal through a plunger mounted within the stylus pen, the plunger being movable in response to pressure exerted on the erasure end of the stylus pen;

detecting a first threshold of pressure on the erasure end of the stylus pen by detecting the signal transmitted through the plunger when the plunger is in close proximity or physical contact with a mechanical switch;

detecting a second threshold of pressure on the erasure end of the stylus pen when the plunger switches the mechanical switch.

B. The method of paragraph A, wherein the mechanical switch is a dome switch and switching the mechanical switch includes depressing the dome switch until an electrical connection is made between the dome switch and a conductive pad.

C. The method of paragraph A or B, wherein transmitting the signal is using a first communication protocol and when the second threshold of pressure is detecting transmitting a separate signal using a second communication protocol, different than the first communication protocol.

D. The method of any of paragraphs A through C, wherein the mechanical switch is conductive and the detecting of the first threshold of pressure includes detecting of the signal transmitted through the mechanical switch.

E. The method of any of paragraphs A through D, wherein the detecting of the signal includes detecting a capacitive coupling between the mechanical switch and the plunger.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope of these claims.

We claim:

1. A stylus device comprising:

a body;

a plunger slideably mounted within the body, the plunger being at least partially conductive so that an electrical signal generated by a controller on the device is transmittable through the plunger on a signal conductor between the controller and the plunger;

a cap coupled to the plunger;

a compression spring coupled to the plunger to provide a spring action to the cap, wherein the signal conductor is coupled to the spring, which is electrically coupled to the cap;

a conductive mechanical switch mounted within the body such that a gap is present between the conductive mechanical switch and the plunger when the compression spring is in a relaxed state, wherein the plunger is movable towards the conductive mechanical switch when the compression spring is in a compressed state; and a circuit configured to detect a characteristic indicative of a distance between the plunger and the conductive mechanical switch, and configured to detect whether the plunger is in contact with the conductive mechanical switch without physical actuation of the conductive mechanical switch, wherein the electrical signal is configured to be transmitted by the controller out of the cap to an external computing device and to be transmitted back through the mechanical switch for detection by the controller so as to form a closed-loop circuit in a first actuation state, wherein the compression spring provides a first threshold of pressure for performing a first of two electronic functions and the mechanical switch contributes to a second threshold of pressure, different than the first threshold of pressure, for performing a second of the two electronic functions.

2. The stylus of claim 1, wherein the conductive mechanical switch is a dome switch that is depressable to make an electrical contact with a conductive pad.

3. The stylus of claim 1, wherein the characteristic is a capacitance formed between the plunger and the conductive mechanical switch.

4. The stylus of claim 1, wherein the circuit is configured to detect a capacitive coupling between the plunger and the conductive mechanical switch when the distance between the conductive mechanical switch and the plunger is less than the gap.

5. The stylus of claim 1, wherein the electrical signal is an erase signal transmitted from the device to erase content on a computing device.

6. The stylus of claim 2, wherein the conductive pad is a first conductive pad, the gap is a first gap, and the device comprises a second conductive pad, wherein a second gap between the conductive mechanical switch and the second conductive pad exists when the plunger is not in contact with the conductive mechanical switch.

7. A stylus comprising:
a first end of the stylus having a stylus tip;
a second end of the stylus opposite the first end of the stylus having a depressable cap, the second end of the stylus coupled to a signal conductor and configured to transmit a signal received on the signal conductor through the depressable cap as a wireless communication to an external device;
a mechanical switch;
a plunger coupled between the depressable cap and the mechanical switch, the plunger being at least partially conductive and electrically coupled to the signal conductor, the plunger configured to be movable to a second position wherein the plunger contacts the mechanical switch, but without compression of the mechanical switch, so that the signal on the signal conductor is configured to pass through the mechanical switch;
a controller coupled to the mechanical switch, the controller configured to be electrically coupled to the signal conductor and configured to detect the signal from the signal conductor through the mechanical switch when the plunger is in the second position so as to form a closed-loop circuit in the second position; and
a compression spring coupled to the plunger to provide a spring action to the depressable cap, the compression spring electrically coupled to the depressable cap, wherein the signal conductor has a first end coupled to the controller and a second end directly coupled to the compression spring, such that the compression spring passes the signal through the plunger to the controller, wherein the plunger is movable to a third position when the mechanical switch is depressed, and the stylus is configured to transmit control signals using a first communications protocol with the plunger in the second position and to transmit control signals using a second communications protocol with the plunger in the third position, the first communications protocol being different than the second communications protocol.

8. The stylus of claim 7, wherein, in the second position, an erase signal is transmitted from the device.

9. The stylus of claim 7, wherein the compression spring is being in a relaxed state when the plunger is in a first position wherein a gap is present between the mechanical switch and the plunger, and in a compressed state when the plunger is in the second position.

10. The stylus of claim 7, wherein a first threshold pressure is required to move the plunger to the second position and the first threshold pressure is associated with the compression spring, and a second threshold pressure is required to move the plunger to the third position and the second threshold pressure is associated with the compression spring and the mechanical switch.

11. The stylus of claim 7, wherein the controller is configured to detect a capacitive coupling between the plunger and the mechanical switch when they are in close proximity.

12. A method comprising:
transmitting a signal from an erasure end of a stylus pen, the erasure end being an end opposite a stylus pen tip, the signal being generated by a controller in the stylus pen for communicating synchronization information or erasure information with a computing device;
transmitting the signal from the controller via a signal conductor to a plunger mounted within the stylus pen and a compression spring coupled to the plunger to provide a spring action to a cap coupled to the plunger, the compression spring electrically coupled to the cap to pass the signal from the controller to the plunger and the cap, the signal conductor having a first end coupled to the controller and a second end directly coupled to the compression spring, the plunger being movable in response to pressure exerted on the erasure end of the stylus pen; and
detecting that a first threshold of pressure is exceeded on the erasure end of the stylus pen by detecting the signal transmitted from the controller through the plunger and back to the controller when the plunger is in close proximity or physical contact with a mechanical switch but without actuation of the mechanical switch, wherein the first threshold of pressure is for performing a first of two electronic functions, and detecting that a second threshold of pressure, different from the first threshold of pressure, is exceeded on the erasure end of the stylus pen when the plunger switches the mechanical switch, wherein the second threshold of pressure is for performing a second of the two electronic functions.

13. The method of claim 12, wherein the mechanical switch is a dome switch and switching the mechanical switch includes depressing the dome switch until an electrical connection is made.

14. The method of claim 12, wherein transmitting the signal is using a first communication protocol, the method further comprising:
when exceeding the second threshold of pressure is detected, transmitting a separate signal using a second communication protocol, different than the first communication protocol.

15. The method of claim 12, wherein the mechanical switch is conductive and the detecting of the first threshold of pressure includes detecting of the signal transmitted through the mechanical switch.

16. The method of claim 12, wherein the detecting of the signal includes detecting a capacitive coupling between the mechanical switch and the plunger.

* * * * *